(12) United States Patent
Voigtlaender

(10) Patent No.: US 7,671,806 B2
(45) Date of Patent: Mar. 2, 2010

(54) ANTENNA SYSTEM FOR A RADAR TRANSCEIVER

(75) Inventor: Klaus Voigtlaender, Wangen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/794,648

(22) PCT Filed: Nov. 28, 2005

(86) PCT No.: PCT/EP2005/056259

§ 371 (c)(1),
(2), (4) Date: Feb. 28, 2008

(87) PCT Pub. No.: WO2006/072511

PCT Pub. Date: Jul. 13, 2006

(65) Prior Publication Data

US 2008/0316106 A1    Dec. 25, 2008

(30) Foreign Application Priority Data

Dec. 30, 2004   (DE) .................. 10 2004 063 541

(51) Int. Cl.
*H01Q 1/38* (2006.01)
(52) U.S. Cl. ................ 343/700 MS; 343/833; 343/834
(58) Field of Classification Search .......... None
See application file for complete search history.

(56) References Cited

U.S. PATENT DOCUMENTS

| | | | | |
|---|---|---|---|---|
| 4,835,538 A | * | 5/1989 | McKenna et al. | 343/700 MS |
| 5,745,080 A | | 4/1998 | Jun | |
| 5,977,710 A | * | 11/1999 | Kuramoto et al. | 343/700 MS |
| 6,601,293 B1 | * | 8/2003 | Glenn | 29/841 |
| 7,307,587 B2 | * | 12/2007 | Eom et al. | 343/700 MS |
| 2008/0316126 A1 | * | 12/2008 | Voigtlander | 343/711 |

FOREIGN PATENT DOCUMENTS

| | | |
|---|---|---|
| DE | 196 48 203 | 6/1998 |
| DE | 19648203 | 6/1998 |
| EP | 0207029 | 12/1986 |
| EP | 0795925 | 9/1997 |
| JP | 02141007 | 5/1990 |
| JP | 02252304 | 10/1990 |
| JP | 03074908 | 3/1991 |

* cited by examiner

*Primary Examiner*—Trinh V Dinh
(74) *Attorney, Agent, or Firm*—Kenyon & Kenyon LLP

(57) ABSTRACT

In an antenna system for a radar transceiver, in particular for measuring distance and/or velocity in the surroundings of motor vehicles, having at least one antenna, which includes at least one first part situated on a chip and a second part situated at a distance from the first part and beam-coupled to the first part, the second part of the antenna is situated on an antenna substrate or another chip, which is attached over the first part by flip chip bonds.

8 Claims, 5 Drawing Sheets

ANTENNA SYSTEM FOR A RADAR TRANSCEIVER

RELATED APPLICATIONS

This application is a 371 of PCT/EP05/56259 filed Nov. 28, 2008, which claims priority under 35 U.S.C. 119 to an application filed in Germany application DE 10 2004 063 541.2 filed Dec. 30, 2004, the contents of which are incorporated herein by reference.

FIELD OF THE INVENTION

The present invention relates to an antenna system for a radar transceiver, in particular for ascertaining distance and/or velocity in the surroundings of motor vehicles.

BACKGROUND OF THE INVENTION

Radar transceivers, i.e., transmitter/receiver modules of this type, are used in the microwave and millimeter wavelength ranges for positioning objects in space or for determining velocities, of motor vehicles in particular. Such radar transceivers are used in particular for driver assistance systems which are intended for determining the distance of another vehicle preceding the host vehicle and for distance regulation. A radar transceiver of this type transmits ultra-high-frequency signals in the form of electromagnetic waves, which are reflected from the target object, received again and further processed by the radar transceiver, for positioning objects in space and for determining velocities. A plurality of radar transceivers is often connected to form a single module. When used in automobiles, frequencies in a range of 76 to 81 GHz are preferably used.

German Patent Application No. DE 196 48 203 describes a multibeam radar system for motor vehicles. In this radar system the transmitting and receiving units, as well as the antennas, are situated on different substrates.

An unpublished application having file number 309374 by the present assignee discloses an antenna system for a single-chip radar transceiver having in particular a very thin electrically effective oxide layer, which is technically simple and can be manufactured at a low cost, and which provides high reproducibility, high reliability, and high bandwidth in particular in a range of 76 to 81 GHz. For this purpose, the antenna has a first part situated on the chip and a second part situated at a distance from the first part and beam-coupled to the first part. The second part is situated on a radome, for example.

Both antenna parts may be formed by a patch or a dipole or by a slot, the patch or the dipole being excited by an opposite additional patch, slot, or dipole.

High tolerance chains are obtained due to the system comprising a housing part having an antenna structure, affected by tolerances, on a radiating central/lower part which, in addition to the manufacturing tolerances, also has positioning tolerances. These may be coped with in frequency ranges of less than 30 GHz; however, they sharply increase at higher frequencies, in particular in the frequency range of over 76 GHz and are difficult to take into account. Empirical tests have yielded an absolute tolerance of approximately 20 µm at 122 GHz. Such a dimensional tolerance is extremely difficult to achieve by mechanical means.

An object of the present invention is therefore to refine an antenna system for a radar transceiver of the generic type so that, in addition to simple assembly of the components of the radar transceiver and, in particular of its antenna, high reproducibility and high reliability are achieved even in the frequency ranges of 77, 120, or 140 GHz.

SUMMARY OF THE INVENTION

This object is achieved by an antenna system for a radar transceiver according to the present invention.

A basic idea of the present invention is to situate the second part of the antenna on an antenna substrate or another chip, which is itself attached over the first part by flip chip bonds. The second part of the antenna is thus not attached to a housing part, which is situated over the first part of the antenna forming the radiator part of the antenna, by mechanical assembly as known from the related art. Due to the self-focusing effect caused by the flip chip bonds due to surface tension, the antenna substrate or the other chip and thus the second part of the antenna are aligned to the first antenna part situated on the chip. This makes dimensional tolerances of less than 20 µm feasible.

The antenna substrate may be made of the most diverse materials. In an advantageous embodiment the antenna substrate is formed by a soft board substrate. However, it may also be implemented using a metal-plated ceramic substrate.

The chip on which the first part of the antenna is situated may also be made of a soft board substrate. It may also be a ceramic or a low-temperature cofired ceramic (LTCC).

The chip and the additional chip may be formed by a silicon and/or silicon-germanium and/or silicon-germanium:c chip. Such a chip may then in turn be mounted on a substrate made of soft board, ceramic, or LTCC. Chip and substrate form a single unit in this case.

The flip chip bonds are advantageously implemented by essentially truncated sphere-shaped soldered bonds, known as bumps. In the case of bumps having a ball diameter of 100 µm, tolerances of less than 20 µm may thus be implemented between the first and second antenna parts.

In an advantageous embodiment, at least part of the soldered bonds forms a shield mass which is electrically conductively connected to a mass of the chip. An additional upper shielding mass, which is connected to the circuit of the radar transceiver, may be implemented in this way.

The shielding may be very advantageously further improved by the soldered bonds, known as bumps, having a spacing which is less than 1/10 of the wavelength of the radiation emitted by the antenna.

Situating the antenna substrate in flip chip bonding technology over the first part of the antenna on a chip has the considerable advantage that very accurate reproducibility is implementable due to the above-described self-focusing. In addition, mounting the antenna substrate parallel to the chip surface on which the first part of the antenna is situated is implementable even if the chip itself is mounted crooked.

Due to the compact design, bonds to other parts, bushings, track conductors situated at a deeper level in the case of multilayer substrates, and the like may be formed in addition to the antenna substrate.

DETAILED DESCRIPTION

Figure 1:
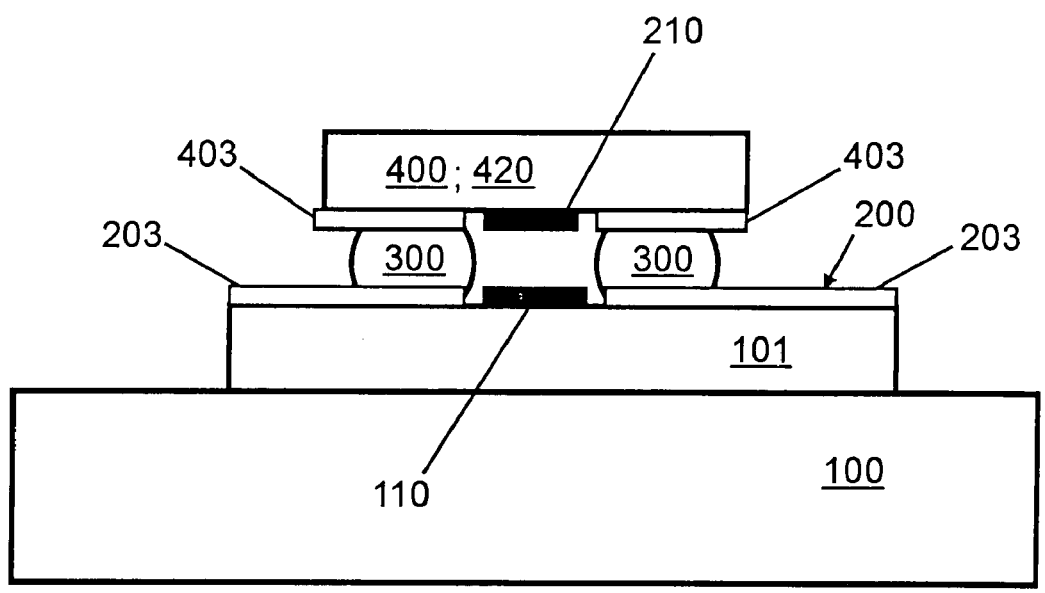
FIG. 1 schematically shows a sectional view of an exemplary embodiment of an antenna system of a radar transceiver in patch-patch coupling making use of the present invention.
Figure 2:
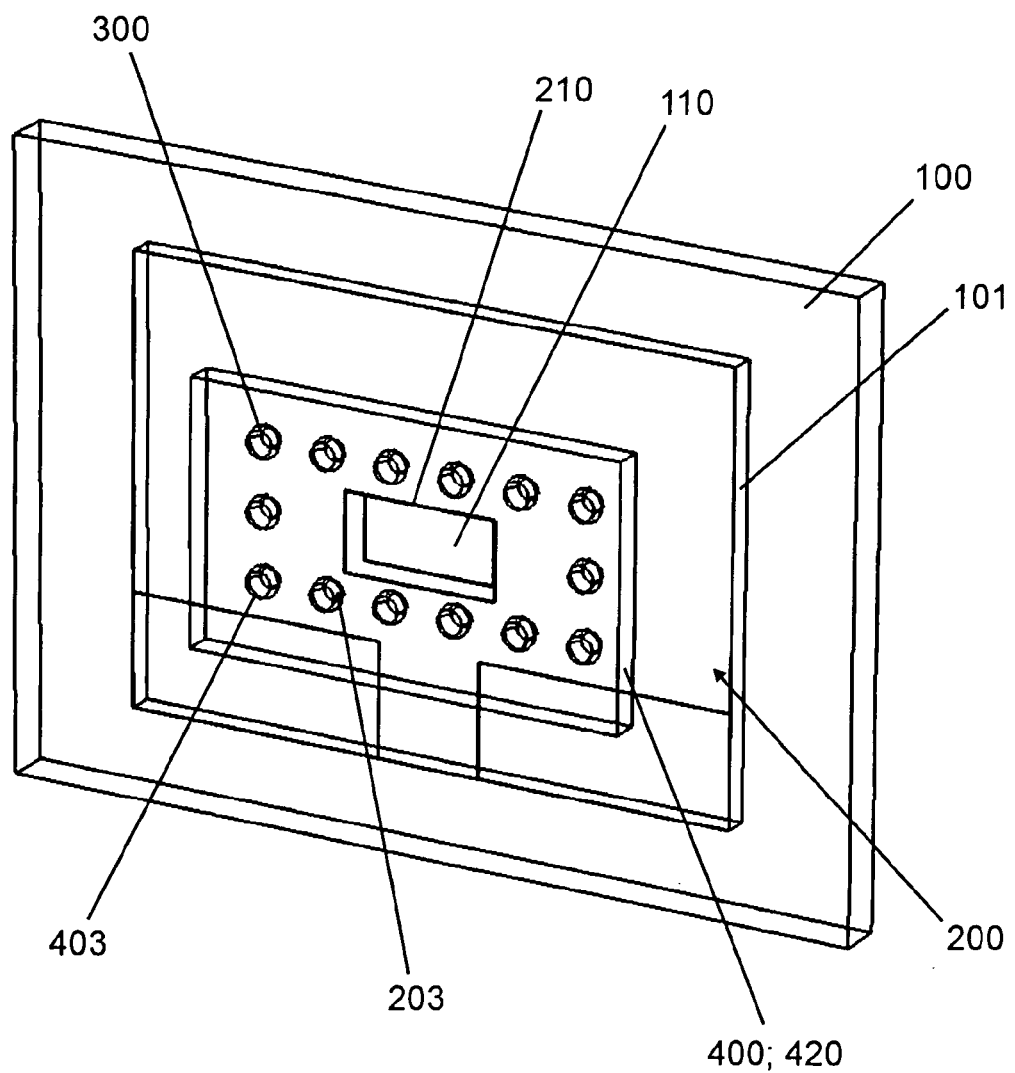
FIG. 2 schematically shows the antenna system depicted in FIG. 1 in perspective view.

A radar transceiver depicted in FIGS. 1 and 2 includes a chip 101, which is situated on a substrate 100, for example, on a soft board substrate or a ceramic. A first part 110 of an antenna is situated on the soft board substrate. A second, metallic antenna part 210 which is also supported by an antenna substrate 400, for example, another soft board substrate, is situated over first part 110 of the antenna, a patch for example.

Instead of an antenna substrate 400, another chip 420 may also be provided to support the antenna part.

Antenna substrate 400 or additional chip 420 are attached to chip 101 or substrate 100 by flip chip technology with the aid of bumps 300 on contact surfaces 203, 403, i.e., soldered bonds which essentially have the shape of a truncated cone. Due to the self-focusing effect caused by the surface tension, by using this type of attachment a very high degree of accuracy is achieved in the alignment of the two antenna parts with respect to one another. Thus, in the case of a diameter of 100 μm of bumps 300, tolerances of less than 20 μm may be implemented. Second part 210 of the antenna, the metallic antenna structure, may thus be attached very accurately over first part 110 of the antenna, the patch situated on chip 101 or substrate 100.

Additional chip 420 is advantageously controllable via the bumps; furthermore, in principle, it may also be situated on an additional substrate (not depicted).

Figure 3:
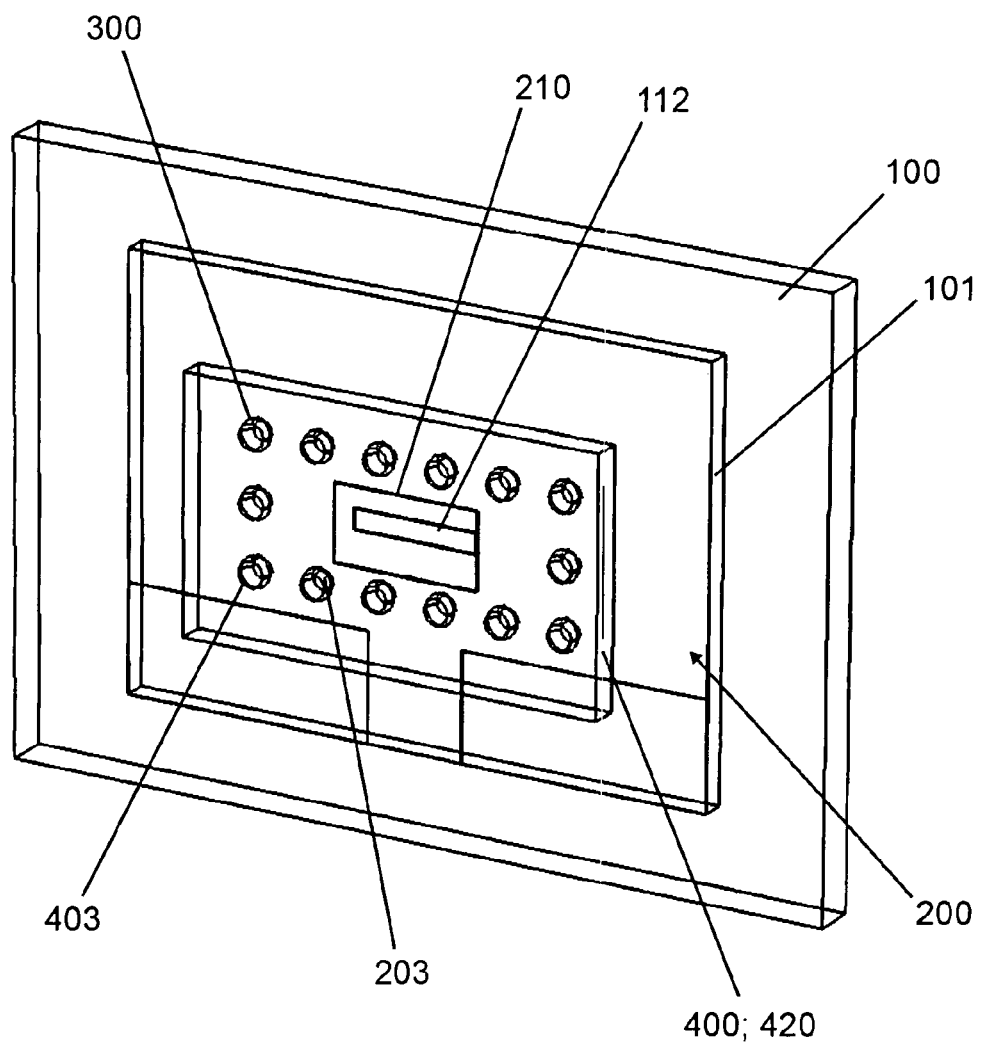
FIG. 3 schematically shows an exemplary embodiment of an antenna system of a radar transceiver in slot-patch coupling making use of the present invention.
Figure 4:
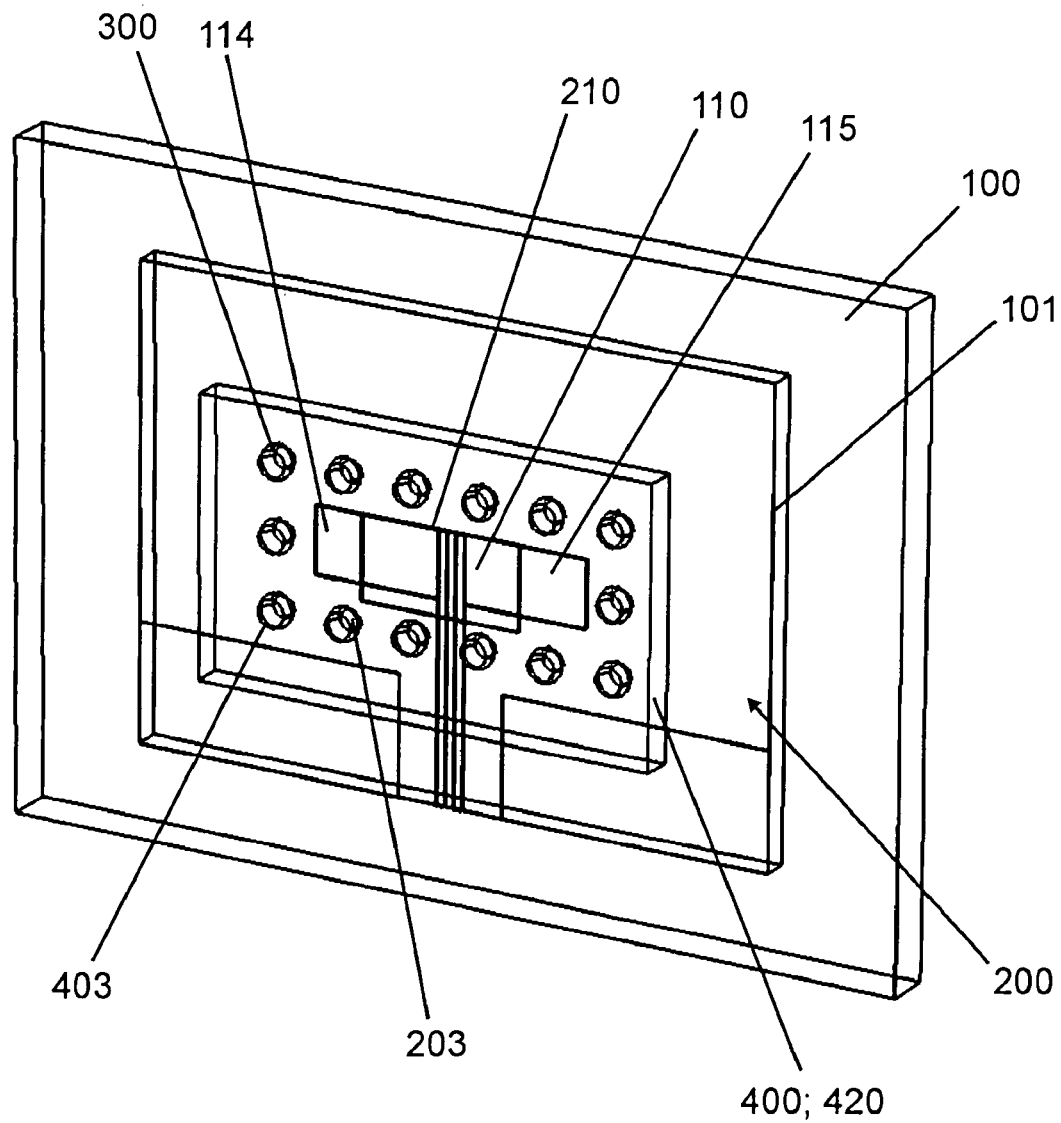
FIG. 4 schematically shows another exemplary embodiment of an antenna system for a radar transceiver in patch-symmetric dipole coupling making use of the present invention.
Figure 5:
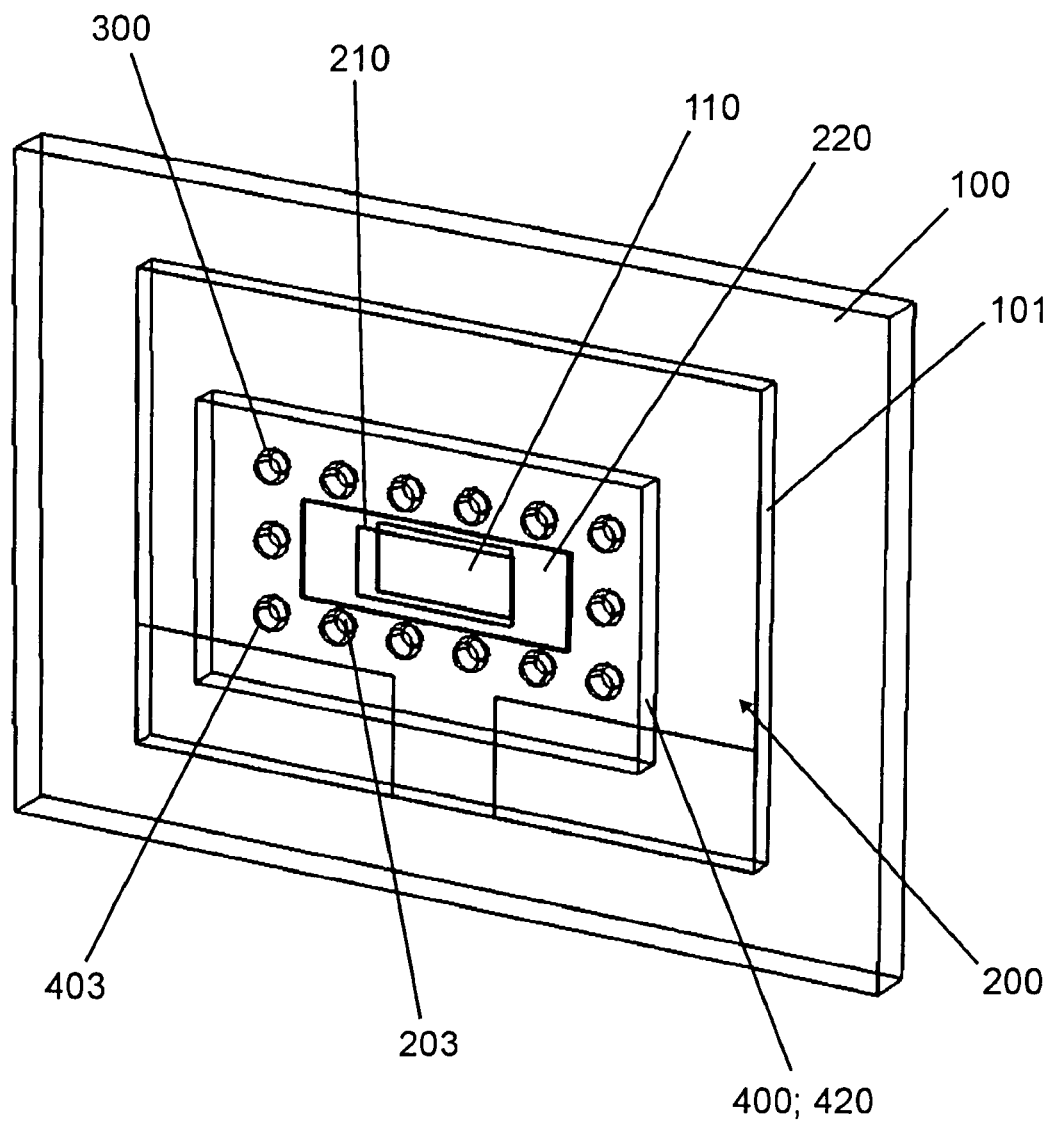
FIG. 5 shows an exemplary embodiment of an antenna system for a radar transceiver in patch-patch coupling having a mass edge, making use of the present invention.

In the exemplary embodiments depicted in FIGS. 3, 4, and 5 the same elements as in FIGS. 1 and 2 are provided with the same reference numerals, so that reference is made to the above for their description. Contrary to the exemplary embodiment of FIGS. 1 and 2, in the exemplary embodiment depicted in FIG. 3, a slot-patch coupling is provided, i.e., instead of a patch, a slot 112 is situated on chip 101 as a first antenna part.

The exemplary embodiment depicted in FIG. 4 is a symmetric dipole-patch coupling, where a symmetric dipole 114, 115 is situated on the chip, forming the first antenna part. Patch 210 as the second antenna part is situated over this dipole.

Of course, the present invention is not restricted to the depicted antenna structures, but, in principle, any other shapes such as rectangular, round, or chamfered patches or dipoles may also be provided. In addition, the most diverse shapes of slot coupling are possible, such as rectangular, round, hollow conductors, and the like.

The number of soldering points, known as bumps 300, may be selected arbitrarily. Bumps 300, however, may also be used specifically for connecting a circumferential mass edge on the antenna substrate to a lower mass. This provides improved shielding against undesirable radiation such as depicted in FIG. 5 as an example. FIG. 5 differs from the exemplary embodiment depicted in FIGS. 1 and 2 in that, in addition to the two antenna parts 110, 210, an additional circumferential mass edge 220 is provided on antenna substrate 400, which is electrically conductively connected to the mass situated on chip 101.

Chip 101 may be a silicon, silicon-germanium, or silicon-germanium:C chip. It may also be formed by a CMOS component. Substrate 100 and the other (not depicted) substrate, on which additional chip 420 is situated, may preferably be formed by a soft board, a ceramic, or a low-temperature-cofired ceramic (LTCC).

The spacing of bumps 300 may be selected arbitrarily in principle. To achieve an additional shielding effect, the spacing of the bumps should be less than $\frac{1}{10}$ of the wavelength emitted by the antenna system.

What is claimed is:

1. An antenna system for a radar transceiver, comprising:
   a first base;
   a second base; and
   at least one antenna, which includes at least one first part situated on the first base and a second part situated at a distance from the first part and coupled to the first part, the second part of the antenna being situated on the second base, which is attached over the first part by flip chip bonds that are substantially truncated sphere-shaped soldered bonds.

2. The antenna system as recited in claim 1, wherein the antenna system is for measuring at least one of a distance and a velocity in surroundings of a motor vehicle.

3. The antenna system as recited in claim 1, wherein at least one of the first base and the second base is made using at least one of the following materials: silicon, silicon-germanium, silicon-germanium:C chip, CMOS component.

4. The antenna system as recited in claim 1, further comprising a substrate on which the first base is situated.

5. The antenna system as recited in claim 4, wherein the substrate is composed of at least one of ceramic and low-temperature cofired ceramic.

6. The antenna system as recited in claim 1, wherein the second base is able to be contacted via the soldered bonds.

7. The antenna system as recited in claim 1, wherein at least a part of the soldered bonds forms a shielding mass which is electrically conductively connected to the first base.

8. The antenna system as recited in claim 1, wherein a spacing of the soldered bonds among one another is less than $\frac{1}{10}$ of a wavelength of radiation emitted by the antenna.

* * * * *